US005164799A

United States Patent [19]

Uno

[11] Patent Number: 5,164,799

[45] Date of Patent: Nov. 17, 1992

[54] THIN-FILM ELECTROLUMINESCENT DEVICE HAVING A DUAL DIELECTRIC STRUCTURE

[75] Inventor: Yasuhiro Uno, Kanagawa, Japan

[73] Assignee: Fuji Xerox Co., Ltd., Tokyo, Japan

[21] Appl. No.: 691,426

[22] Filed: Apr. 25, 1991

[30] Foreign Application Priority Data

Apr. 26, 1990 [JP] Japan ............................ 2-108922

[51] Int. Cl.[5] ............................ H01L 33/00

[52] U.S. Cl. ............................ 313/509; 313/503; 313/506

[58] Field of Search ............................ 357/49, 17, 61, 67; 362/800; 313/498, 499, 506, 509, 503

[56] References Cited

U.S. PATENT DOCUMENTS

| | | | |
|---|---|---|---|
| 4,594,282 | 6/1986 | Kawaguchi et al. | 313/509 |
| 4,672,266 | 6/1987 | Taniguchi et al. | 313/509 |
| 4,721,631 | 1/1988 | Endo et al. | 313/506 |
| 4,947,081 | 8/1990 | Ohiwa et al. | 313/509 |
| 4,975,338 | 12/1990 | Kageyama et al. | 313/509 |
| 5,003,221 | 3/1991 | Shimizu | 313/509 |

OTHER PUBLICATIONS

Matsuoka et al., "An AC Thin Film EL Display with Pr–Mn Oxide Black Dielectric Material", IEEE, vol. ED-33, No. 9, Sep. 1986.

*Primary Examiner*—Rolf Hille
*Assistant Examiner*—Minhloan Tran
*Attorney, Agent, or Firm*—Finnegan, Henderson, Farabow, Garrett and Dunner

[57] ABSTRACT

A thin-film electroluminescent device having a dual dielectric structure, said device comprising a substrate having consecutively thereon a lower electrode, a first dielectric layer, a luminescent layer, a second dielectric layer and an upper electrode, one of a metal oxide film, a metal nitride film and a metal film being interposed either (a) between said luminescent layer and said first dielectric layer or (b) between said luminescent layer and said second dielectric layer or (c) both between said luminescent layer and said first dielectric layer and between said luminescent layer and said second dielectric layer.

17 Claims, 4 Drawing Sheets

THIN-FILM ELECTROLUMINESCENT DEVICE HAVING A DUAL DIELECTRIC STRUCTURE

FIELD OF THE INVENTION

The present invention relates to a thin-film electroluminescent (EL) device, and particularly a structure of a thin-film EL device suitable for use as a large-area device, typically a display panel.

BACKGROUND OF THE INVENTION

Thin-film EL devices have advantage in that light-emitting devices can be fabricated on large-area substrates by film-forming techniques such as evaporation and sputtering. Devices fabricated in this manner can be assembled into a flat panel display. The flat panel display is composed of a plurality of thin-film EL devices in the form of a matrix array and a circuit for driving them. The conventional structure of each thin-film EL device is described below with reference to FIG. 5.

As shown in FIG. 5, the thin-film EL device has a dual dielectric structure which comprises a glass substrate 11 that is overlaid, in this order, with a lower electrode 12 that serves as one electrode for the matrix (X axis electrode), a first dielectric layer 13, a luminescent layer 14, a second dielectric layer 15, and an upper electrode 16 that serves as the other matrix electrode (Y axis electrode).

In order to operate the flat panel display having the above matrix structure, an A.C. electric field with a voltage of from 200 to 250 V is applied to the luminescent layer 14 between the lower electrode 12 and the upper electrode 16, whereupon light is emitted from the luminescent layer 14. If the number of the electrodes on the X axis is n, and the number of electrodes on the Y axis is m in the flat panel display, (m+n) of driver circuits (not shown) are necessary to drive the display. In other words, a plurality of ICs (not shown) are required to drive the display.

However, as already mentioned, the voltage required to trigger light emission from the luminescent layer 14 in the thin-film EL device having the structure described above is as high as 200 to 250 V and this requires that the driving ICs serving as switching elements for the respective thin-film EL devices should be capable of withstanding such high voltage. Since special processes are required to fabricate such driving ICs having high withstand voltage, they are expensive and this leads to an increase in the production cost of flat panel displays.

SUMMARY OF THE INVENTION

The present invention has been achieved under these circumstances.

An object of the present invention is to provide a thin-film EL device that is capable of triggering the emission of light from the luminescent layer at a lower voltage than in the prior art.

Other objects and effects of the present invention will be apparent from the following description.

The present invention, in the first aspect, relates to a thin-film electroluminescent device having a dual dielectric structure, the device comprising a substrate having consecutively thereon a lower electrode, a first dielectric layer, a luminescent layer, a second dielectric layer and an upper electrode, a metal oxide film being interposed either (a) between the luminescent layer and the first dielectric layer or (b) between the luminescent layer and the second dielectric layer or (c) both between the luminescent layer and the first dielectric layer and between the luminescent layer and the second dielectric layer.

In the second aspect of the present invention, the metal oxide film in the above first aspect may be replaced by a metal nitride film.

In the third aspect of the present invention, the metal oxide film in the above first aspect may be replaced by a metal film.

DETAILED DESCRIPTION OF THE INVENTION

Figure 1:
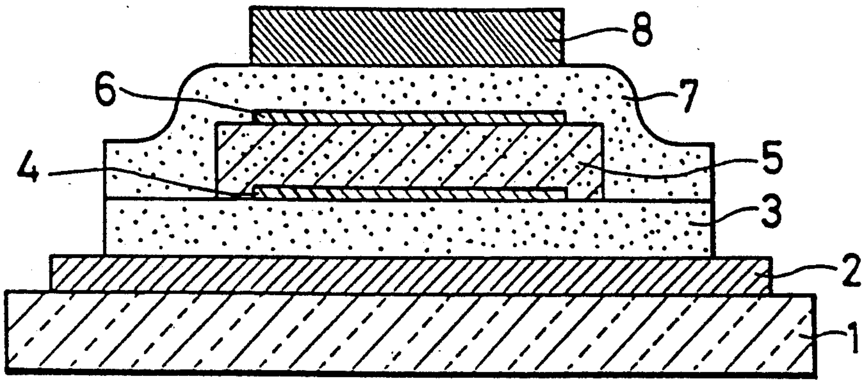
FIG. 1 is a cross-sectional view of a thin-film EL device according to one embodiment of the first aspect of the present invention.

In the first aspect of the present invention, a metal oxide film is interposed between the luminescent layer and either one or both of the two dielectric layers. This permits the energy level at the interface between the luminescent layer and the metal oxide film to be located in a shallower position than the conduction band edge of the luminescent layer and, at the same time, a large number of free electrons are permitted to exist at the interface, whereby the threshold electric field for triggering light emission from the luminescent layer can be made lower than in the prior art.

In the second aspect of the present invention, a metal nitride film is interposed between the luminescent layer and either one or both of the two dielectric layers. This permits the energy level at the interface between the luminescent layer and the metal nitride film to be located in a shallower position than the conduction band edge of the luminescent layer and, at the same time, a large number of free electrons are permitted to exist at the interface, whereby the threshold electric field for triggering light emission from the luminescent layer can be made lower than in the prior art.

In the third aspect of the present invention, a thin metal film is interposed between the luminescent screen and either one or both of the two dielectric layers. This permits the energy level at the interface between the luminescent layer and the metal film to be located in a shallower position than the conduction band edge of the luminescent layer and, at the same time, a large number of free electrons are permitted to exist at the interface, whereby the threshold electric field for triggering light emission from the luminescent layer can be made lower than in the prior art.

Examples of the material for the metal oxide film of the first aspect of the present invention include $WO_x$ and $MoO_x$. Examples of the material for the metal nitride film of the second aspect of the present invention include TiN and TaN. Examples of the material for the metal film of the third aspect of the present invention include Au, W, Mo, Ti and Ta. Among the above materials, Mo and $WO_3$ are preferably used in the present invention.

The thickness of the metal oxide film, the metal nitride film and the metal film is preferably from 10 to 500 Å, and more preferably from 10 to 100 Å.

The metal oxide film, the metal nitride film and the metal film can be provided by electron beam (EB) evaporation, sputtering, plasma-assisted chemical vapor deposition (CVD) or evaporation through resistive heating.

The material and the thickness for the other layers than the oxide film, the metal nitride film and the metal film, i.e., the substrate, the lower and upper electrodes, the first and second dielectric layers and the luminescent layer, are not particularly limited and those conventional in this field of art may be employed.

The substrate may be a glass plate or an organic plastic film.

Examples of the materials for the lower electrode include $In_2O_3$, $SnO_3$ and ITO composed of $In_2O_3$ and $SnO_3$. The upper electrode is generally composed of aluminum and may also be $In_2O_3$, $SnO_3$ or ITO when the objective EL device is a transparent EL device, multi-color display panel composed of plural EL devices superimposed each other and the like.

Examples of the materials for the first and second dielectric layers include SiN, $BaTiO_3$ , $Y_2O_3$, $Si_3N_4$, $Sm_2O_3$, $TaO_5$, $BaTiO_3$, $PbTiO_3$, $SiO_2$ and $SrTiO_3$. The first and second dielectric layers each may have a double layer structure composed of two different materials.

Examples of the materials for the luminescent layer include ZnS:$TbF_3$, ZnS:Mn, ZnS:Tm, SrS:Eu, ZnS:Mn,Cu, Zn(S,Se):Cu,I, ZnSiCu, SrS:Ce, $Ba_2$ZnS:Mn, CaS:Ce, ZnS:Te,Mn and CaS:Eu.

The method for providing the other layers than the oxide film is not particularly limited and EB evaporation, sputtering, plasma-assisted CVD and evaporation through resistive heating may be used. The luminescent layer is preferably provided by sputtering.

The thin-film EL device according to the present invention may further be provided with a surface protective layer.

A thin-film EL device according to one embodiment of the first aspect of the present invention is described below with reference to FIG. 1. As shown in FIG. 1, the thin-film EL device comprises a glass substrate 1 which is overlaid, in this order, with a transparent lower electrode 2, the first dielectric layer 3 made of a dielectric material such as SiN, a metal oxide film 4 made of a metal oxide such as $WO_x$, a luminescent layer 5 made of a light-emitting material such as ZnS:$TbF_3$, a metal oxide film 6 made of a metal oxide such as $WO_x$, the second dielectric layer 7 made of a dielectric material such as SiN, and an upper metal electrode 8.

The transparent electrode 2 is a transparent conductive film (composed of ITO) that is deposited in a thickness of 1,500 Å by electron beam (EB) evaporation or sputtering and which is subsequently patterned by photolithographic etching.

The first dielectric layer 3 and the second dielectric layer 7 are formed by depositing a dielectric material such as SiN in a thickness of 2,000 Å by sputtering or plasma-assisted chemical vapor deposition (CVD) in such a manner that the deposited layer completely covers the luminescent layer 5.

The metal oxide films 4 and 6 are each formed of a thin film of a conductive metal oxide such as $WO_x$ or $MoO_x$ that is deposited by EB evaporation or reactive sputtering preferably in a thickness of 100 Å or less. These metal oxide films are preferably formed in a thin thickness since thicker films have a tendency to be shorted between themselves. Further, each of the metal oxide films is formed over a smaller area than the luminescent layer 5 so as to prevent them from contacting each other.

The luminescent layer 5 is formed by depositing a light-emitting material such as ZnS:$TbF_3$ in a thickness of 4,000 Å by EB evaporation or sputtering.

The metal electrode 8 is a layer of a metal such as aluminum that is deposited in a thickness of 4,000 Å by EB evaporation or sputtering and which is subsequently patterned by photolithographic etching.

Figure 2:
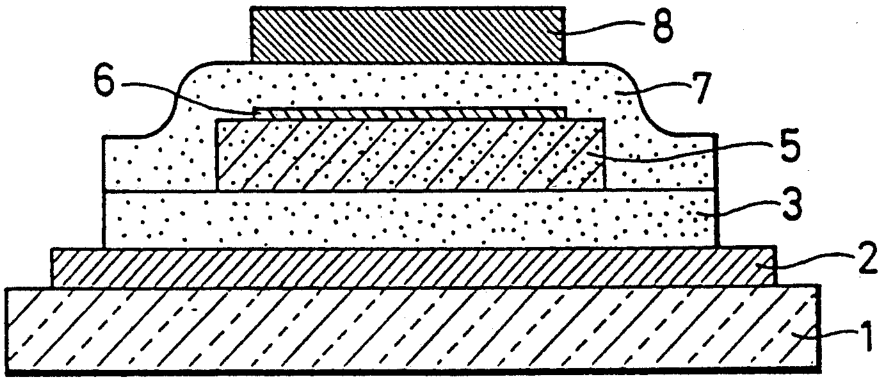
FIGS. 2 and 3 are cross-sectional views of a thin-film EL device according to other embodiments of the first aspect of the present invention.
Figure 3:
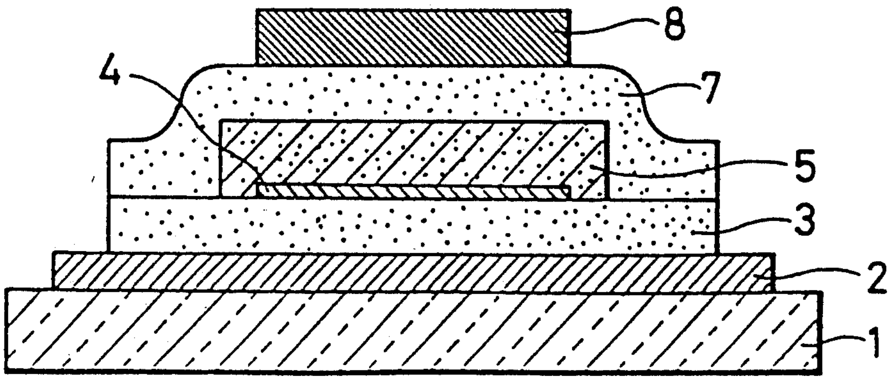

In the embodiment discussed above, the metal oxide film 4 is formed below the luminescent layer 5 and at the same time the metal oxide layer 6 is formed on top of the luminescent layer 5. If desired, a metal oxide layer may be formed only on top of the luminescent layer 5 as indicated by 6 in FIG. 2; alternatively, a metal oxide layer may be formed only below the luminescent layer 5 as indicated by 4 in FIG. 3.

In the embodiment discussed above, two metal oxide layers are interposed, one between the dielectric layer 3 and the luminescent layer 5 and the other between the dielectric layer 7 and the luminescent layer 5. If desired, a semiconductive metal nitride films may be substituted for the metal oxide films 4 and 6 by depositing a semiconductive material such as $TaN_x$ preferably in a thickness of 100 Å or less by EB evaporation or reactive sputtering in accordance with the second aspect of the present invention. Alternatively, a thin metal film may be substituted for the metal oxide and nitride films by depositing a metal layer preferably in a thickness of 100 Å or less by EB evaporation, sputtering or evaporation through resistive heating in accordance with the third aspect of the present invention. Metals that can be used include W, Ta, Mo and Au.

The thin EL device according to the embodiment discussed above will operate on the following principle. When a high electric field of the order of 2.0 MV/cm is applied to the luminescent layer 5 of an electroluminescent device that is deposed with a fluoride of rare earth element as a radiative recombination center, electrons at the energy level of the interface between the luminescent layer 5 and the dielectric layer 3 will travel through the luminescent layer 5 and collide with radiative recombination centers in it to produce electroluminescence. The electrons leaving the interface energy level are transferred to the energy level at the opposite interface between the luminescent layer 5 and the dielectric layer 7 and, if a reverse electric filed is applied by ac voltage, those electrons will travel back through the luminescent layer 5 and the same process as described above is repeated. The electroluminescence thus-produced is radiated from the side of the glass substrate 1 to the atmosphere.

Figure 4:
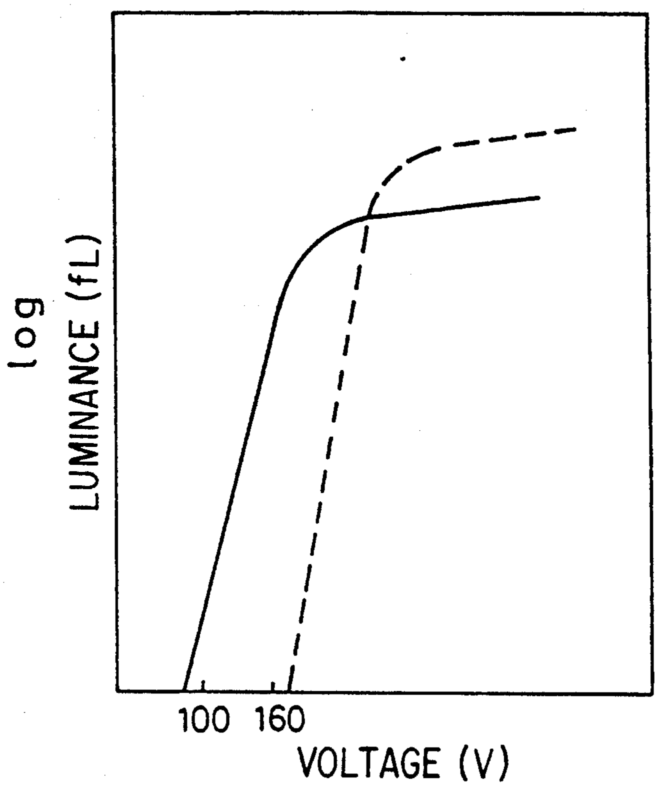
FIG. 4 is a graph showing the relationship between applied voltage and the intensity of light emission.
Figure 5:
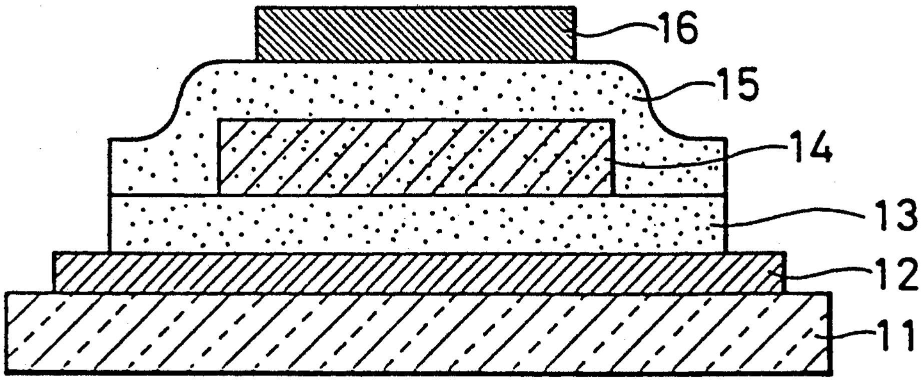
FIG. 5 (PRIOR ART)
FIG. 5 is a cross-sectional view of a prior art thin-film EL device.

In the embodiments discussed above, a metal oxide film (or a metal nitride film or a thin metal film) is interposed either between the luminescent layer 5 and the first dielectric layer 3 or between the luminescent layer 5 and the second dielectric layer 7 or between the luminescent layer and each of the first and second dielectric layers. This arrangement permits a shallower energy level to be formed at the interface between the interposed film and the luminescent layer and, at the same time, a large number of free electrons are permitted to exist at that interface. As a consequence, the threshold electric field for light-emission from the luminescent layer is reduced from the conventional level of the order of 2.0 MV/cm to a lower level of the order of 0.8 MV/cm. This is graphically depicted in FIG. 4 which shows the relationship between applied voltage and the intensity of electroluminescence. In FIG. 4, the dashed line refers to the profile attained by an EL device adopting the prior art structure whereas the solid line refers to the profile attainable by an EL device fabricated in accordance with the embodiment discussed above. Obviously, the voltage for triggering light emission can be lowered from a level of the order of 200 V to a level of the order of 100 V by adopting the structure specified herein. Therefore, because of the absence of the need to apply high voltage, the EL device of the present invention can be operated without using an expensive driving IC that is capable of withstanding high voltage.

Further, when metal oxide films, metal nitride films and thin metal films that are 100 Å or less in thickness insure a transparency of about 80%, the intensity of electroluminescence produced from the luminescent layer 5 will not be substantially attenuated by the metal oxide film (or metal nitride film or thin metal film) 4 positioned the closer to the glass substrate 1. However, in order to enhance the efficiency of light emission, the metal oxide film (or metal nitride film or thin metal film) is preferably formed only on the side closer to the metal electrode 8 as indicated by 6 in FIG. 2.

According to the present invention, a metal oxide film, a metal nitride film or a thin metal film is interposed between the luminescent layer and one or both of the two dielectric layers and this not only forms a shallower energy level at the interface between the luminescent layer and the interposed film but also permits an increased number of free electrons to exist at that interface, whereby the threshold electric field for triggering light emission from the luminescent layer can be lowered as compared to the prior art. As a consequence, the need to apply high voltage to the EL device is eliminated and it can be operated without using an expensive driving IC adapted to withstand high voltage. Therefore, a flat panel display incorporating drive circuits drive circuits can be manufactured at a lower cost.

The present invention will be described in more detail by referring to the following examples and comparative examples, but is not construed as being limited thereto.

EXAMPLE 1 AND COMPARATIVE EXAMPLE 1

A thin-film EL device according to the present invention having the following layer construction was prepared (Example 1).

| Layer | Material | Thickness (Å) | Provision method* |
|---|---|---|---|
| Upper electrode | Al | 10,000 | EB |
| Second dielectric layer | p-SiN | 2,600 | P-CVD |
| Upper metal film | Mo | 100 | EB |
| Luminescent layer | $ZnS:TbF_3$ | 2,600 | EB |
| Lower metal film | Mo | 100 | EB |
| First dielectric layer | p-SiN | 2,600 | P-CVD |
| Lower electrode | ITO | 1,000 | EB |

-continued

| Layer | Material | Thickness (Å) | Provision method* |
|---|---|---|---|
| Substrate | glass | — | — |

Note:
*EB: electron beam evaporation
P-CVD: plasma-assisted chemical vapor deposition Another thin-film EL device was prepared in the same manner as above except that the upper and lower metal films were not provided (Comparative Example 1).

The above-obtained thin-film EL devices of Example 1 and Comparative Example 1 were applied with an A.C. voltage of 1 kHz and were measured for the luminance.

Figure 6:
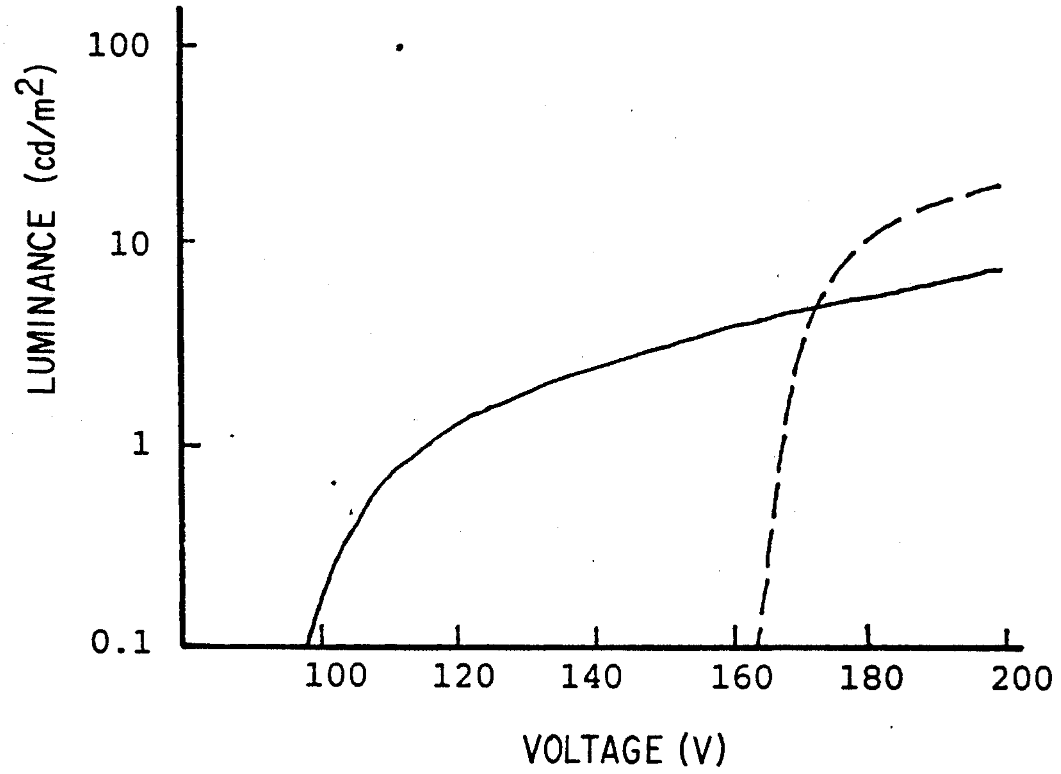
FIGS. 6 and 7 are the results obtained in Examples 1 and 2 and Comparative Examples 1 and 2.

The results obtained are shown in FIG. 6. The solid line refers to the results of Example 1 and the dashed line refers to the results of Comparative Example 1.

EXAMPLE 2 AND COMPARATIVE EXAMPLE 2

A thin-film EL device according to the present invention having the following layer construction was prepared (Example 2).

| Layer | Material | Thickness (Å) | Provision method* |
|---|---|---|---|
| Upper electrode | Al | 4,600 | EB |
| Second dielectric layer | p-SiN | 2,500 | P-CVD |
| Metal oxide film | $WO_3$ | 100 | EB |
| Luminescent layer | $ZnS:TbF_3$ | 2,800 | EB |
| First dielectric layer | p-SiN | 2,500 | P-CVD |
| Lower electrode | ITO | 1,000 | EB |
| Substrate | glass | — | — |

Note:
*EB: electron beam evaporation
P-CVD: plasma-assisted chemical vapor deposition Another thin-film EL device was prepared in the same manner as above except that the metal oxide film was not provided (Comparative Example 2).

The above-obtained thin-film EL devices of Example 2 and Comparative Example 2 were applied with an A.C. voltage of 1 kHz and were measured for the luminance.

Figure 7:
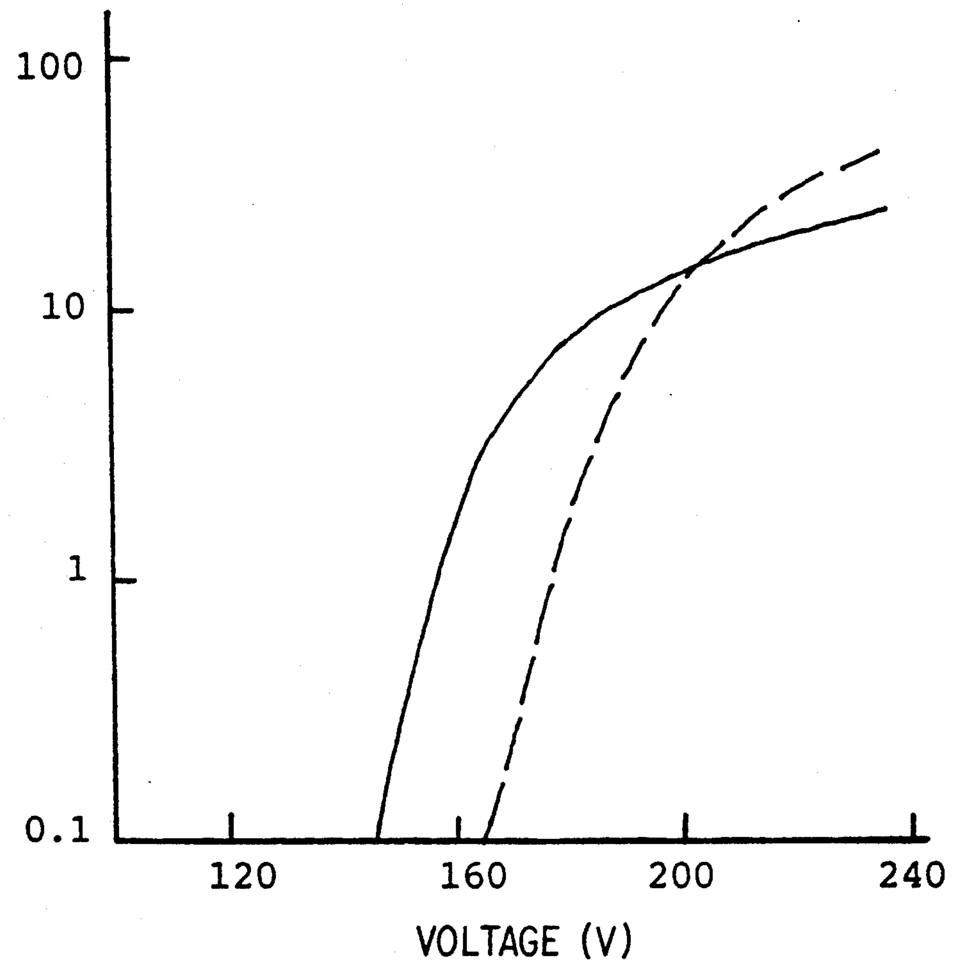

The results obtained are shown in FIG. 7. The solid line refers to the results of Example 2 and the dashed line refers to the results of Comparative Example 2.

It is understood from the results of Examples 1 and 2 and Comparative Examples 1 and 2 that the threshold electric field for triggering light emission can be lowered by the present invention.

While the invention has been described in detail and with reference to specific examples thereof, it will be apparent to one skilled in the art that various changes and modifications can be made therein without departing from the spirit and scope thereof.

What is claimed is:

1. A thin-film electroluminescent device having a dual dielectric structure, said device comprising a substrate having consecutively thereon a lower electrode, a first dielectric layer, a luminescent layer, a second dielectric layer and an upper electrode, a metal oxide film interposed between said luminescent layer and at least one of said first dielectric layer and said second dielectric layer, wherein said metal oxide film is a material selected from the group consisting of $WO_x$ and $MoO_x$.

2. A thin-film electroluminescent device as claimed in claim 1, wherein said metal oxide film is $WO_3$.

3. A thin-film electroluminescent device as claimed in claim 1, wherein said metal oxide film has a thickness in the range of 10 to 500 Å.

4. A thin-film electroluminescent device as claimed in claim 3, wherein said metal oxide film has a thickness in the range of 10 to 100 Å.

5. A thin-film electroluminescent device having a dual dielectric structure, said device comprising a substrate having consecutively thereon a lower electrode, a first dielectric layer, a luminescent layer, a second dielectric layer and an upper electrode, a metal nitride film being interposed between said luminescent layer and at least one of said first dielectric layer and said second dielectric layer, wherein said metal nitride film has a thickness in the range of 10 to 100 Åand is a material selected from the group consisting of TiN and TaN.

6. A thin-film electroluminescent device having a dual dielectric structure, said device comprising a substrate having consecutively thereon a lower electrode, a first dielectric layer, a luminescent layer, a second dielectric layer and an upper electrode, a metal film being interposed between said luminescent layer and at least one of said first dielectric layer and said dielectric layer.

7. A thin-film electroluminescent device as claimed in claim 6, wherein said metal film is a material selected from the group consisting of Au, W, Mo, Ti and Ta.

8. A thin-film electroluminescent device as claimed in claim 7, wherein said metal film is Mo.

9. A thin-film electroluminescent device as claimed in claim 6, wherein said metal film has a thickness in the range of 10 to 500 Å.

10. A thin-film electroluminescent device as claimed in claim 9, wherein said metal film has a thickness in the range of 10 to 100 Å.

11. A Thin-film electroluminescent device having a dual dielectric structure, said device comprising a substrate having consecutively thereon a lower electrode, a first dielectric layer, a first thin film, a luminescent layer, a second thin film, a second dielectric layer and an upper electrode, wherein said first thin film and said second thin film are electrically isolated from each other, and both said first and second thin films comprise at least one composition selected from the group consisting of a metal oxide, a metal nitride and a metal.

12. A thin-film electroluminescent device as claimed in claim 11, wherein said thin film is composed of a metal oxide.

13. A thin-film electroluminescent device as claimed in claim 12, wherein said metal oxide is a material selected from the group consisting of $WO_x$ and $MoO_x$.

14. A thin-film electroluminescent device as claimed in claim 11, wherein said thin film is composed of a metal nitride.

15. A thin-film electroluminescent device as claimed in claim 14, wherein said metal nitride is a material selected from the group consisting of TiN and TaN.

16. A thin-film electroluminescent device as claimed in claim 11, wherein said thin film is composed of a metal.

17. A thin-film electroluminescent device as claimed in claim 16, wherein said metal is a material selected from the group consisting of Au, W, Mo, Ti, and Ta.

* * * * *

UNITED STATES PATENT AND TRADEMARK OFFICE

CERTIFICATE OF CORRECTION

PATENT NO. : 5,164,799

DATED : November 17, 1992

INVENTOR(S) : Yasuhiro Uno

It is certified that error appears in the above-identified patent and that said Letters Patent is hereby corrected as shown below:

Claim 5, Column 7, Line 20, change "Åand" to --Å and--; and

Claim 6, Column 7, Line 28, after "said" (second occurrence) insert --second--.

Signed and Sealed this

Fourteenth Day of December, 1993

Attest:

Bruce Lehman

BRUCE LEHMAN

*Attesting Officer* *Commissioner of Patents and Trademarks*